(12) United States Patent
Kim

(10) Patent No.: US 8,169,038 B2
(45) Date of Patent: May 1, 2012

(54) SEMICONDUCTOR DEVICE AND METHOD OF MANUFACTURING THE SAME

(75) Inventor: Mi Young Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 79 days.

(21) Appl. No.: 12/628,119

(22) Filed: Nov. 30, 2009

(65) Prior Publication Data

US 2010/0140701 A1 Jun. 10, 2010

(30) Foreign Application Priority Data

Dec. 5, 2008 (KR) ........................ 10-2008-0123049

(51) Int. Cl.
*H01L 29/78* (2006.01)
(52) U.S. Cl. ........ 257/401; 257/288; 257/368; 257/409; 257/E29.242; 257/E29.268; 438/197
(58) Field of Classification Search .................. 257/401, 257/500, 501, E29.268, 288, 368, 409, E29.242; 438/295, 197
See application file for complete search history.

(56) References Cited

U.S. PATENT DOCUMENTS 6,064,086 A * 5/2000 Nakagawa et al. ........... 257/335
* cited by examiner

*Primary Examiner* — Matthew E Warren
*Assistant Examiner* — John Lin
(74) *Attorney, Agent, or Firm* — The Law Offices of Andrew D. Fortney; Andrew D. Fortney; Ryan S. Dunning

(57) ABSTRACT

A semiconductor device and a method of manufacturing the same are disclosed. The method includes forming ion impurity regions of a first conductivity type by forming a trench in a semiconductor substrate and implanting impurity ions into a lower portion of the trench at different depths; forming an oxide region in the substrate adjacent to one end of the trench; forming a device isolation film filling the trench; forming a high voltage well in the substrate and a second conductivity type body in the high voltage well; forming a gate on the semiconductor substrate partially overlapping the device isolation film; forming second well in the semiconductor substrate at one side of the device isolation film overlapping the ion diffusion regions and the oxide region; and forming source regions in the body and a drain region in the second well.

18 Claims, 4 Drawing Sheets

SEMICONDUCTOR DEVICE AND METHOD OF MANUFACTURING THE SAME

This application claims the benefit of Korean Patent Application No. 10-2008-0123049, filed on Dec. 5, 2008, which is hereby incorporated by reference as if fully set forth herein.

BACKGROUND OF THE DISCLOSURE

1. Field of the Disclosure

The present invention relates to semiconductor devices, and more particularly, to a semiconductor device and a method of manufacturing the same, in which an on-resistance characteristic is maintained and at the same time a breakdown voltage can be improved.

2. Discussion of the Related Art

An example of a power semiconductor device includes a device which is operable at a high voltage, close to a theoretical breakdown voltage of a semiconductor. If an external system which uses a high voltage is controlled by an integrated circuit, the integrated circuit may require a built-in semiconductor device for controlling the high voltage. Namely, the semiconductor device for the high voltage may require a structure that has a high breakdown voltage.

That is, in a drain or a source of a transistor to which the high voltage is directly applied, a punch through voltage between the drain and source and the semiconductor substrate, and the breakdown voltage between the drain and source and a well or substrate may be higher than the high voltage. A lateral diffused MOS (LDMOS) is a semiconductor device for the high voltage.

FIG. 1A and FIG. 1B are cross-sectional views illustrating a general LDMOS transistor. As illustrated in FIG. 1A, the LDMOS transistor includes a high voltage N-well region 110, a device isolation film 120, a P type body 115, a gate oxide film 130, source regions 140 and 150, an N type well region 135, a drain region 145, a gate 160, and a spacer 165.

When the LDMOS transistor is turned off, if a positive voltage is applied to the drain region 145, an electric field is formed below the gate 160. At this time, the electric field is formed most densely at a boundary 125 where one end of the device isolation film 120 and the drain region 145 of high density meet. Accordingly, breakdown occurs at the boundary, thereby limiting a breakdown voltage of the LDMOS transistor.

FIG. 1B illustrates a structure for solving the problem of FIG. 1A. As the distance between the LDMOS transistor and the source region 140 increases, a size of the device increases and a current path becomes long, whereby on-resistance (Ron) characteristic may deteriorate.

SUMMARY OF THE DISCLOSURE

Accordingly, the present invention is directed to a semiconductor device and a method of manufacturing the same, which substantially obviate one or more problems due to limitations and disadvantages of the related art.

An object of the present invention is to provide a method of manufacturing a semiconductor device, in which an on-resistance characteristic is maintained, and at the same time, a breakdown voltage can be improved.

Additional advantages, objects, and features of the disclosure will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a semiconductor device may comprise forming a plurality of ion impurity regions of a first conductivity type by forming a trench in a semiconductor substrate and implanting impurity ions into a lower portion of the trench at different depths; forming an oxide region in the semiconductor substrate adjacent to one end of the trench; forming a device isolation film by filling the trench; forming a high voltage first conductivity type well in the substrate and a second conductivity type body in the high voltage well; forming a gate on the semiconductor substrate partially overlapping the device isolation film; forming a first conductivity type second well in the semiconductor substrate at one side of the device isolation film, overlapping the ion diffusion regions and the oxide region; and forming source regions in the body and a drain region in the second well.

The step of forming a plurality of ion diffusion regions may include forming a plurality of ion implantation regions of a first conductivity type at different depths by implanting first conductivity type impurity ions into the high voltage well below the trench at different times and at different ion implantation energies; and forming the plurality of ion diffusion regions by performing an annealing process on the semiconductor substrate.

The step of forming an oxide film includes forming an oxygen implantation region in a high voltage first conductivity type first well adjacent to one end of the trench through an oxygen (e.g., $O_2$) implant process; and forming the oxide region in the $O_2$ implantation region during the annealing process that is performed for forming the plurality of ion implantation regions.

In another aspect of the present invention, a semiconductor device may comprise a high voltage first conductivity type well in a semiconductor substrate; a second conductivity type body in the high voltage well; a device isolation film in the high voltage well; a plurality of first conductivity type ion diffusion regions having different depths in the high voltage well below the device isolation film; an oxide region in the high voltage well adjacent to one end of the device isolation film; a first conductivity type second well in the high voltage well at one side of the device isolation film overlapping the ion diffusion regions and the oxide region; a gate on the semiconductor substrate partially overlapping an opposite side of the device isolation film; and source regions in the body and a drain region in the second well.

The semiconductor device and the method of manufacturing the same according to embodiments of the present invention have the following advantages.

Since the oxide region is formed in a region adjacent to one end of the device isolation film at which electric fields are concentrated, and the plurality of ion diffusion regions are formed below the device isolation film, the electric field's generally do not concentrate at the end of the device isolation film. At the same time, the on-resistance of the device (e.g., the LDMOS transistor) is maintained, and the breakdown voltage can be improved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incor- In the drawings.

DETAILED DESCRIPTION

Reference will now be made in detail to the specific embodiments of the present invention, examples of which are illustrated in the accompanying drawings. Wherever possible, the same reference numbers will be used throughout the drawings to refer to the same or like parts.

FIG. 2A to FIG. 2H are process cross-sectional views illustrating a method of manufacturing an LDMOS transistor according to embodiments of the present invention.

Figure 1A:
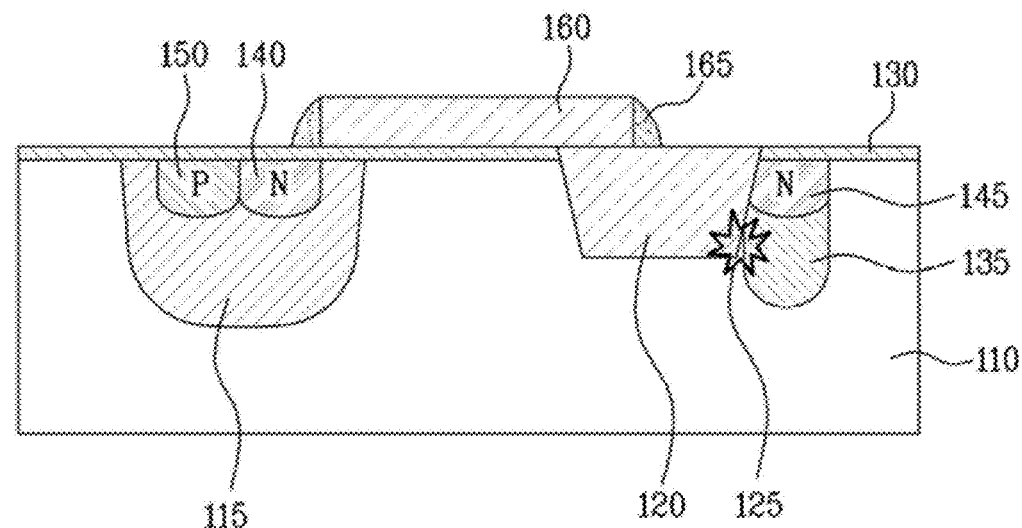
FIG. 1A and FIG. 1B are cross-sectional views illustrating a general LDMOS transistor.
Figure 1B:
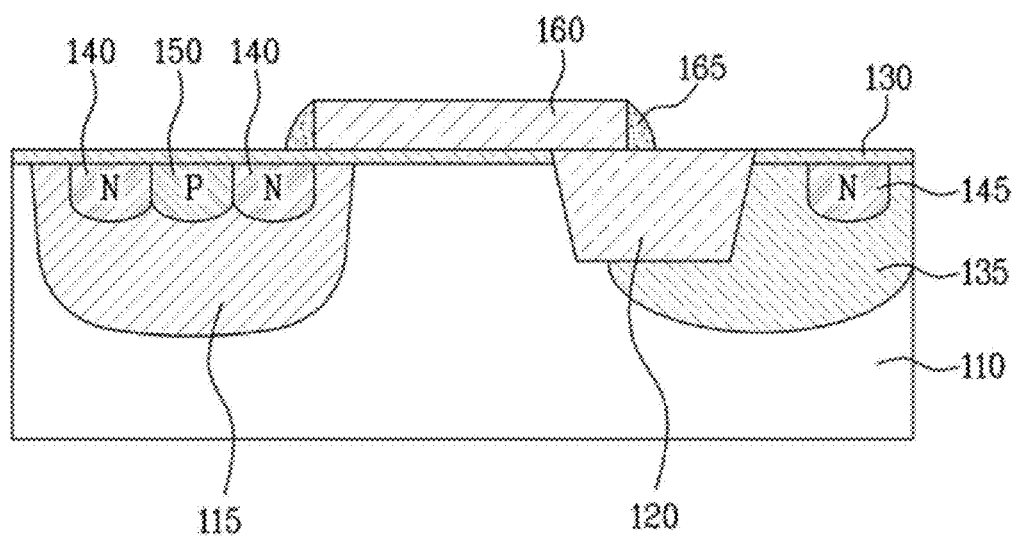
Figure 2A:
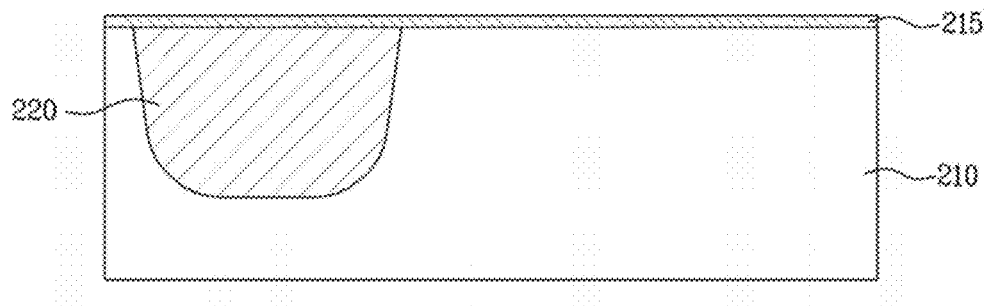
FIG. 2A to FIG. 2H are process cross-sectional views illustrating a method of manufacturing an LDMOS transistor according to embodiments of the present invention.

First of all, as illustrated in FIG. 2A, first conductivity type impurity ions (for example, N type impurity ions) are implanted into a semiconductor substrate through a mask (not shown) and a first oxide film 215 formed on the semiconductor substrate, whereby a first conductivity type well 210 adapted for high voltage operations is formed. Alternatively, the semiconductor substrate could be a P type silicon substrate, and the first conductivity type well 210 could be an N type well.

Second conductivity type impurity ions are implanted into one region of the high voltage N type well 210 through a mask (not shown), whereby a second conductivity type (for example, P type) body 220 is formed.

Figure 2B:
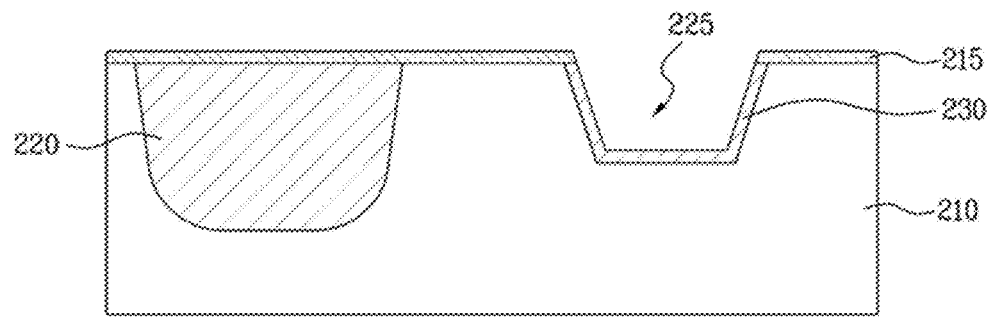

Next, as illustrated in FIG. 2B, a trench 225 for forming a device isolation film is formed in the semiconductor substrate in a portion of the high voltage N type well 210. For example, the trench 225 can be formed using a photoresist pattern (not shown) that exposes a region of the high voltage N type well 210 and that is also used for forming shallow trench isolation (STI) structures elsewhere in the chip or die, and the exposed region is etched using the photoresist pattern as a mask. Then, the photoresist pattern is removed.

Subsequently, a second oxide film 230 is grown on sidewalls and on the bottom of the trench 225 by a thermal oxidation process. For example, oxidation can occur only on the exposed parts of the silicon substrate 210 after the trench 225 is formed, whereby the second oxide film 230 can be grown.

Figure 2C:
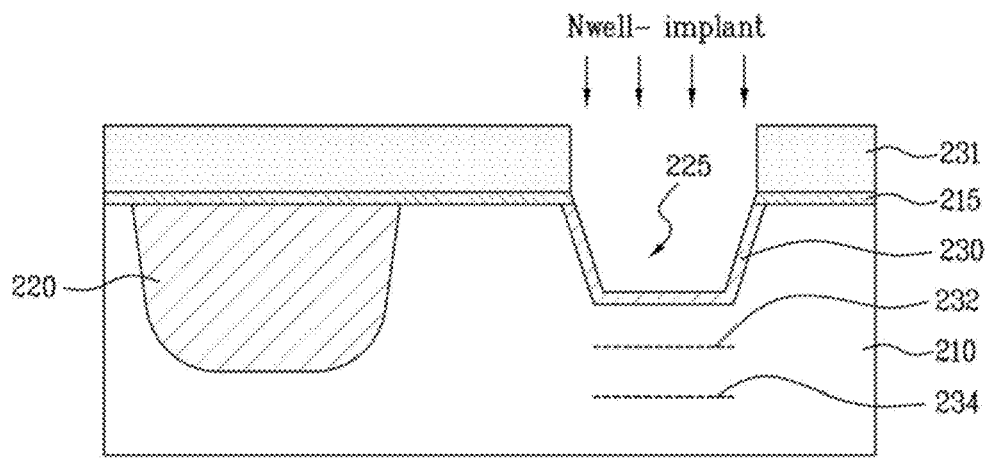

As illustrated in FIG. 2C, a well implant is performed such that first conductivity type impurity ions are implanted into the N type well 210 below the trench 225 where the oxide film 230 is grown, a plurality of times using different ion implantation energies. A first well implant may be performed at a first energy, by which the impurity ions are implanted at a first depth (e.g., implant 234), and a second well implant may be performed at a second energy, by which the impurity ions are implanted at a second depth different from the first depth (e.g., implant 232), whereby a plurality of ion implant regions of the first conductivity type can be formed. The ions implanted in the first and second well implants may be the same (e.g., P, As, Sb, etc.) or different (e.g., the first well implant may comprise P, and the second well implant may comprise As and/or Sb, etc.). Although a first ion implantation region 232 and a second ion implantation region 234, which are formed at different depths, are shown in FIG. 2C, the present invention is not limited to the example of FIG. 2C.

For example, a first photoresist pattern 231 that exposes the trench 225 is formed on the semiconductor substrate in which the N type well 210 is formed. Then, N type impurity ions are implanted into the N type well 210 below the trench at a first ion implantation energy using the first photoresist pattern 231 as a mask, whereby the first ion implantation region 234 can be formed.

Subsequently, N type impurity ions are implanted into the N type well 210 below the trench at a second ion implantation energy using the first photoresist pattern 231 as a mask, whereby the second ion implantation region 232 can be formed. At this time, the second ion implantation energy is less than the first ion implantation energy.

Figure 2D:
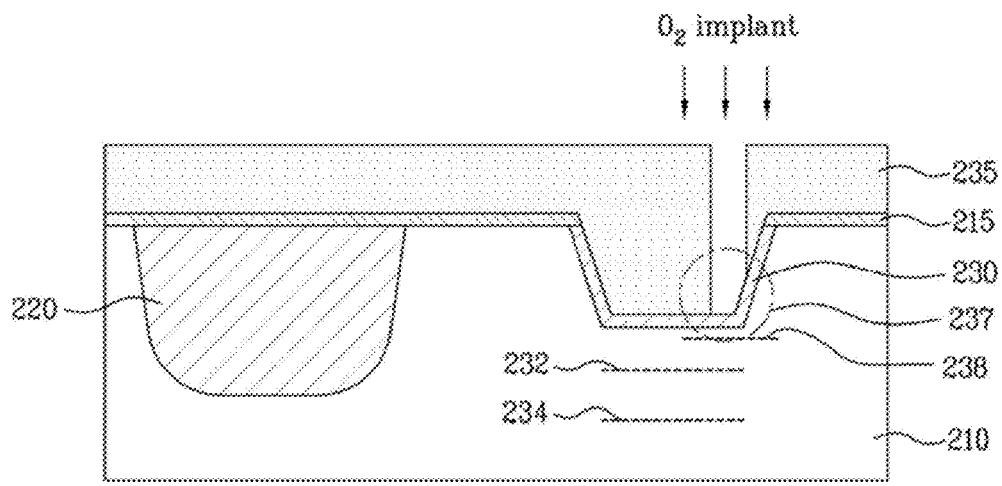

Afterwards, as illustrated in FIG. 2D, the first photoresist pattern 231 is removed by an ashing or stripping process. Subsequently, a second photoresist pattern 235 is formed on the semiconductor substrate, including the plurality of ion implantation regions 232 and 234. The second photoresist pattern exposes a region 237 of the second oxide film 230 adjacent to one end or encompassing a corner region of the trench 225. In one embodiment, the second photoresist pattern exposes the corner region of the trench 225 farthest away from the body 220.

Subsequently, a source of oxygen (e.g., $O_2$, $O_3$, $N_2O$, $NO_2$, etc.) is implanted into the region 237 of the second oxide film 230 adjacent to one end of the trench 225 using the second photoresist pattern as a mask. An oxygen implantation region 238 is formed in the high voltage N type well 210 adjacent to the one end or corner of the exposed trench through the oxygen implantation process.

Figure 2E:
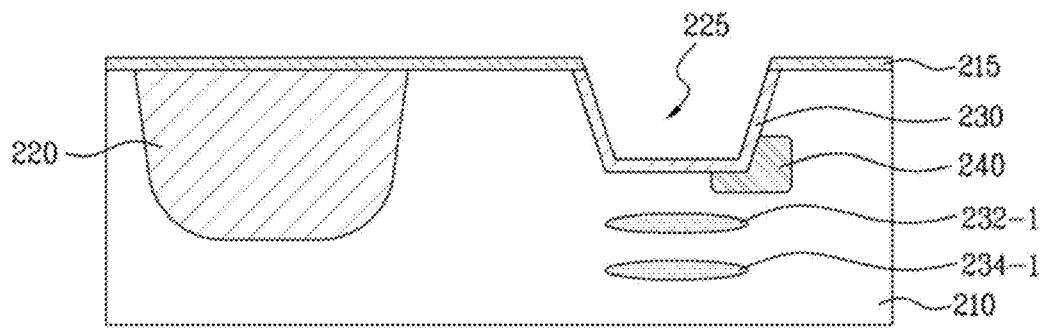

Next, as illustrated in FIG. 2E, the second photoresist pattern 235 is removed by an ashing or stripping process.

Subsequently, one or more annealing processes are performed on the semiconductor substrate including the plurality of ion implantation regions 232 and 234 and the $O_2$ implantation region 238. Ion diffusion regions 232-1 and 234-1 are formed through the annealing process for the ion implantation regions 232 and 234, and an oxide region 240 is formed through the annealing process for the oxygen implantation region 238. Ion diffusion regions 232-1 and 234-1 and oxide region 240 may be formed by the same annealing process or by different annealing processes.

The oxide region 240 can be spaced apart from the ion diffusion regions 232-1 and 234-1 so as not to overlap them.

Figure 2F:
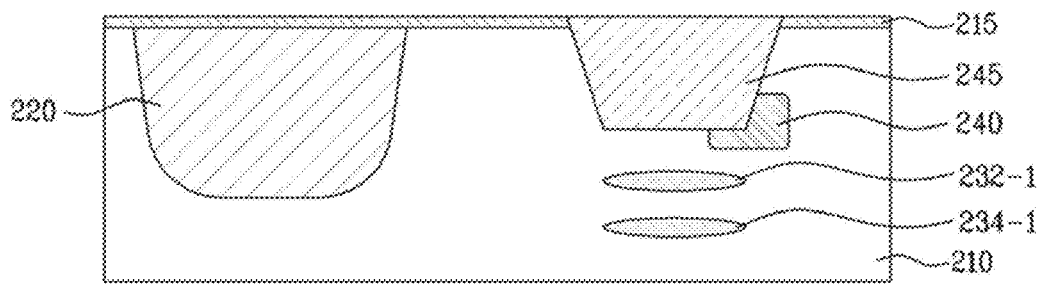

As illustrated in FIG. 2F, an insulator (for example, oxide) is deposited on the substrate and in the trench 225 including the second oxide film 230 thereon, then the portion(s) of the insulator outside of the trench 225 are removed (e.g., by chemical mechanical polishing), whereby a device isolation film 245 is formed. In one alternative embodiment, the oxide region 240 is formed when the insulator deposited in the trench 225 is annealed to densify the device isolation film 245 thereby forming oxide region 240 in the first conductivity type well 210 adjacent to one end of the device isolation film 245, at which electric fields may be concentrated.

Figure 2G:
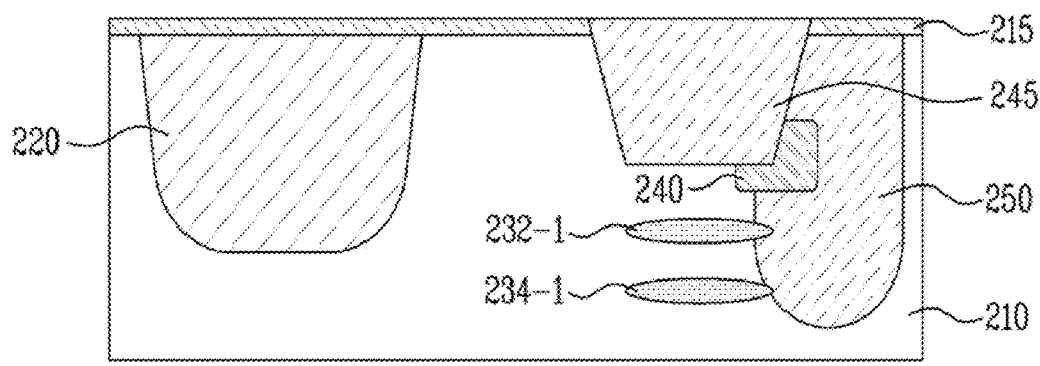

Next, as illustrated in FIG. 2G, a second well 250 having a first conductivity type is formed in the high voltage N type well 210 at one side of the device isolation film 245. Generally, the second well 250 is formed on the same side of the device isolation film 245 as the oxide region 240. Thus, the second well 250 may overlap or be in electrical communication or contact with the ion diffusion regions 232-1 and 234-1, and partially overlaps the oxide region 240.

At this time, the density of the impurity ions implanted to form the second well 250 is higher than that of the impurity ions implanted to form the high voltage well 210.

For example, a third photoresist pattern (not shown) is formed on the semiconductor substrate including the device isolation film 245. The third photoresist pattern can be patterned to partially expose the high voltage well 210 at one side of the device isolation film 245 (e.g., the same side as the oxide region 240). Subsequently, N type impurity ions are implanted into the high voltage well 210 using the third photoresist pattern as a mask, and an annealing process is performed to form the second well 250.

Figure 2H:
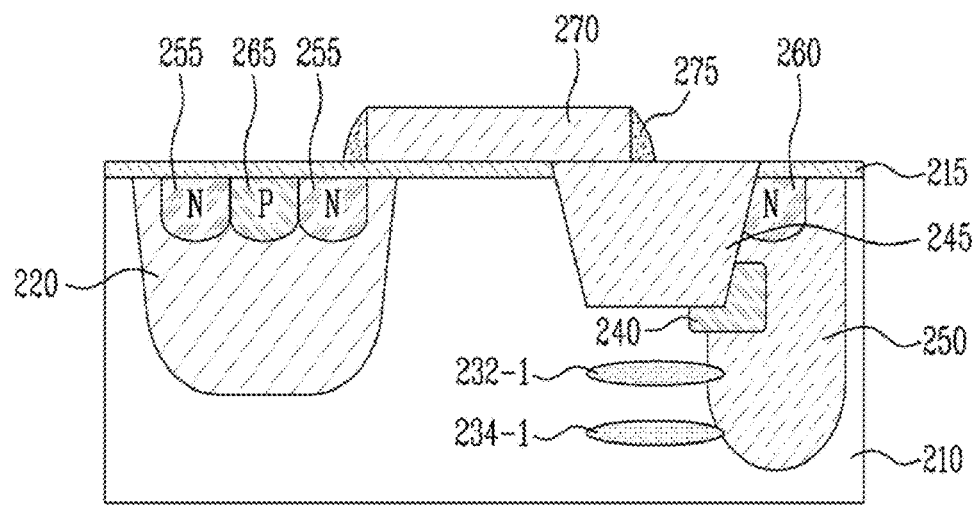

Next, as illustrated in FIG. 2H, a gate 270 is formed on the semiconductor substrate including the second well 250 is formed, so as to partially overlap the device isolation film 245. The gate 270 may be formed by blanket deposition of silicon on the substrate and patterning by photolithography and etching. In one embodiment, the oxide layer 215 may be stripped (e.g., by wet etching) and replaced with a thermal oxide having a predetermined thickness (e.g., sufficient to withstand a relatively high voltage of 5V, 9V, 12V, 20V or more applied to gate 270). One or more source regions 255, 265 are then formed in the P type body 220, and a drain region 260 is formed on a surface of the second well 250 on or adjoining one side of the device isolation film 245 (e.g., the same side as the oxide region 240). The source regions 255 and drain region 260, having the first conductivity type, may be formed at the same time (e.g., in a single implant process using a single mask), but the source region 265 having the second conductivity type is formed separately from the source regions 255 and drain region 260. A spacer 275 is formed at a sidewall of the gate 270, and the exposed portions of the oxide layer 215 may be removed to facilitate formation of an interlayer dielectric (not shown) and/or electrical contacts to the source and drain regions 255, 260, and 265.

FIG. 2H illustrates a semiconductor device according to an embodiment of the present invention. The semiconductor device includes a high voltage well 210 having a first conductivity type in a semiconductor substrate, a body 220 having a second conductivity type in the high voltage well 210, a device isolation film 245 in the high voltage well 210, a plurality of first conductivity type ion diffusion regions 232-1 and 234-1 at different depths in the high voltage well 210 below the device isolation film 245, an oxide region 240 in the high voltage well 210 adjacent to one end of the device isolation film 245, a second well 250 having the first conductivity type in the high voltage well 210 at the one side of the device isolation film 245, overlapping the ion diffusion regions 232-1 and 234-1 and the oxide region 240, a gate 270 on the semiconductor substrate partially overlapping the opposite side of the device isolation film 245, source regions 255 and 265 in the body 220, and a drain region 260 in the second well 250. In this case, the drain region 260 can be adjacent to the one side (i.e., the same sidewall as oxide film 240) of the device isolation film 245.

The semiconductor device illustrated in FIG. 2B can further include an oxide film 230 between the device isolation film 245 and the high voltage well 210. The oxide film 230 may include a thermal oxide.

The plurality of ion diffusion regions 232-1 and 234-1 can be in the high voltage well 210 below the device isolation film 245 in due order or sequence. The plurality of ion diffusion regions 232-1 and 234-1 can be spaced apart from each other and from the oxide region 240 so as not to overlap the oxide region 240. The impurity ion density of the second well 250 can be higher than that of the high voltage well 210.

In the present LDMOS transistor, the oxide region is formed at a region adjacent to one end of the device isolation film 245 at which electric fields may concentrate, whereby the breakdown voltage can be improved. Namely, as the electric fields bypass the oxide region 240, the electric fields can be prevented from concentrating on the region adjacent to the distal end of the device isolation film 245.

When the LDMOS transistor is turned on, since the current flowing in the LDMOS transistor flows from the source regions 255 and 265 to the drain region 260, bypassing the oxide region 240, the on-resistance (Ron) characteristic may deteriorate a little. Accordingly, in embodiments of the present invention, the plurality of ion diffusion regions 232-1 and 234-1 below the device isolation film 245 may lower the current path resistance, whereby the on-resistance characteristic can be maintained (e.g., prevented from deteriorating).

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device comprising:
   a first well in a semiconductor substrate;
   a body in the first well;
   an insulator film in a trench in the first well;
   a plurality of ion diffusion regions at different depths in the first well below the insulator film;
   an oxide region in the first well adjacent to and covering a lower corner of the insulator film, wherein the oxide region is at least partially below the trench;
   a second well in the first well at one side of the insulator film, wherein the second well overlaps the ion diffusion regions and the oxide region; and
   a gate on the semiconductor substrate partially overlapping a side of the insulator film opposite to the one side; and
   source regions in the body and a drain region in the second well.

2. The semiconductor device of claim 1, wherein the first well and the second well have a first conductivity type, and the body has a second conductivity type.

3. The semiconductor device of claim 2, wherein the plurality of ion diffusion regions have the first conductivity type.

4. The semiconductor device of claim 2, wherein the first well is a high voltage well.

5. The semiconductor device of claim 1, further comprising an oxide film between the insulator film and the first well.

6. The semiconductor device of claim 5, wherein the oxide film comprises a thermal oxide.

7. The semiconductor device of claim 1, wherein the plurality of ion diffusion regions are in due order.

8. The semiconductor device of claim 1, wherein the plurality of ion diffusion regions are spaced apart from each other and do not overlap the oxide region.

9. The semiconductor device of claim 1, wherein the second well has an impurity density higher than that of the first well.

10. The semiconductor device of claim 1, wherein the first well is a high voltage well.

11. The semiconductor device of claim 1, wherein the source regions comprise first and second first conductivity type source regions and a second conductivity type source region.

12. The semiconductor device of claim 11, wherein the second conductivity type source region is between the first and second first conductivity type source regions.

13. The semiconductor device of claim 1, wherein the second well has a greater depth than a depth of the body.

14. The semiconductor device of claim 1, wherein the body has a greater depth than a depth of the insulator film.

15. The semiconductor device of claim 14, wherein the second well has a greater depth than the depth of the body.

16. The semiconductor device of claim 1, wherein the ion diffusion regions have a concentration sufficient to lower a current path resistance.

17. The semiconductor device of claim 1, wherein the ion diffusion regions comprise one or more of the group consisting of P, As and Sb.

18. The semiconductor device of claim 17, wherein the ion diffusion regions comprise first and second ion diffusion regions, the first ion diffusion region comprises P, and the second ion diffusion region comprises As and/or Sb.

* * * * *